United States Patent [19]

Silva

[11] Patent Number: 5,751,557
[45] Date of Patent: May 12, 1998

[54] PRINTED CIRCUIT BOARD HAVING A TRIPLE PATTERN FOOTPRINT FOR RECEIVING ONE OF THREE COMPONENT PACKAGES

[75] Inventor: David J. Silva, Trabuco Canyon, Calif.

[73] Assignee: AST Research, Inc., Irvine, Calif.

[21] Appl. No.: 667,617

[22] Filed: Jun. 21, 1996

[51] Int. Cl.$^6$ .................................................. H01R 9/09
[52] U.S. Cl. ............................ 361/777; 361/783; 439/55
[58] Field of Search .......................... 439/55; 361/760, 361/777, 783; 174/260, 261

[56] References Cited

U.S. PATENT DOCUMENTS

| | | | |
|---|---|---|---|
| 3,923,359 | 12/1975 | Newsam | 439/75 |
| 4,511,950 | 4/1985 | Bunner et al. | 361/413 |
| 4,530,002 | 7/1985 | Kanai | 257/697 |
| 4,613,924 | 9/1986 | Brault | 361/767 |
| 4,840,570 | 6/1989 | Mann, Jr. et al. | 439/74 |
| 5,064,378 | 11/1991 | Olson et al. | 439/55 |
| 5,159,536 | 10/1992 | Silverio | 361/400 |
| 5,258,890 | 11/1993 | de Veer | 361/783 |
| 5,386,346 | 1/1995 | Gleadall | 361/799 |
| 5,557,505 | 9/1996 | Silva | 361/777 |
| 5,571,996 | 11/1996 | Swamy, et al. | 174/261 |

FOREIGN PATENT DOCUMENTS

| | | |
|---|---|---|
| 0171232 | 7/1985 | European Pat. Off. . |
| 0246088 | 5/1987 | European Pat. Off. . |
| 2170047 | 1/1986 | United Kingdom . |
| 2233823 | 11/1990 | United Kingdom . |

*Primary Examiner*—Gary F. Paumen
*Assistant Examiner*—T. C. Patel
*Attorney, Agent, or Firm*—Knobbe, Martens, Olson & Bear, LLP

[57] ABSTRACT

A printed circuit board has a first plurality of pin receptors configured to receive a first type of SRAM memory device, a second plurality of pin receptors configured to receive a second type of SRAM memory device and a third plurality of pin receptors configured to receive a third type of SRAM memory device. The first plurality of pin receptors are formed in two parallel lines that extend in a first direction and define a portion of the boundary of a first area of the printed circuit board. The second and third pluralities of pin receptors are formed in the first area of the printed circuit board, with said second and third pluralities of pin receptors each comprising two parallel lines of pin receptors extending in a second direction, substantially orthogonal to the first direction. Conductive traces are formed between corresponding pin receptors in the first, second and third pluralities of pin receptors to thereby allow one of three different types of SRAM memory devices to be positioned on the footprint wherein the footprint occupies only the first area of the printed circuit board.

18 Claims, 4 Drawing Sheets

PRINTED CIRCUIT BOARD HAVING A TRIPLE PATTERN FOOTPRINT FOR RECEIVING ONE OF THREE COMPONENT PACKAGES

BACKGROUND OF THE INVENTION

1. Field of the Invention

The present invention generally relates to printed circuit boards and, more particularly, concerns a printed circuit board having a pattern of pin receptors, known as a footprint, that is capable of receiving one of three different electronic component packages on substantially the same location of a printed circuit board.

2. Description of the Related Art

Personal computers typically include a number of printed circuit boards, which have a plurality of electronic components mounted thereon, to provide the personal computer with its function. The electronic components include integrated circuits and also discrete electronic components that perform specific functions. For example, SRAM and other types of memories are often mounted on printed circuit boards that are used in personal computers. Generally, a printed circuit board has a plurality of pin receptors arranged in a pattern, known as a footprint, which is configured to receive the pins of the package of the electronic component when the package is mounted on the board. The pin receptors are then electrically connected to conductive traces formed in or on the board which interconnect different components mounted on the board.

One difficulty that manufacturers of computers have is that different component manufacturers produce components that perform substantially the same function, but have different pin configurations. Consequently, the printed circuit board manufacturer must design a printed circuit board with a particular manufacturer's component in mind. In the event that the printed circuit board manufacturer wants to use an equivalent component from a competing manufacturer that uses a different package having a different configuration of pins, the printed circuit board manufacturer must redesign the printed circuit board to accommodate the component that has a different configuration of pins.

It will be appreciated that redesigning a printed circuit board for components having different configurations of pins can be expensive for the printed circuit board manufacturer, particularly with complex multi-layer printed circuit boards that are often found in personal computers. For example, there are a variety of manufacturers that manufacture SRAM-type memory devices. A typical SRAM-memory device has a plurality of pins which provide addresses to access storage locations within the memory device. Typically, these types of memory devices from differing manufacturers have the same or equivalent circuit configurations but are often in different packages that have different pin configurations. Consequently, the printed circuit board manufacturer must select an SRAM memory and design the board using the selected SRAM memory with the selected pin configuration.

However, this prevents the printed circuit board manufacturer from periodically purchasing compatible SRAM devices from other suppliers without having to redesign the printed circuit board. Hence, there is a need for a printed circuit board which will allow a manufacturer to accommodate components that perform the same function but have different packages and different pin configurations. It will be appreciated, however, that if multiple footprints of pin receptors are provided on the circuit board, a substantial amount of space on the board may be wasted. This is particularly true with comparatively large components such as SRAM memory devices. This can result in increased manufacturing costs and may result in the printed circuit board exceeding its surface area design constraints. This problem is particularly accentuated in applications such as laptop or notebook computers, wherein the space on the surface of the printed circuit board is at a premium.

Thus, there is a need for a footprint configuration for a printed circuit board that is capable of accommodating more than one component that performs substantially the same function while minimizing the amount of space used by the footprint of pin receptors on the printed circuit board. Further, in the particular application of SRAM memory devices, there is a need for a printed circuit board that is capable of accommodating one of three different SRAM-type memories without requiring additional space on the printed circuit board to be used by extra footprints of pin receptors.

SUMMARY OF THE INVENTION

The aforementioned needs are satisfied by the printed circuit board of the present invention, which includes a first plurality of pin receptors formed in a first pattern on a printed circuit board, wherein the first pattern of pin receptors is configured to receive the pins of an integrated circuit package having a first configuration of pins, and wherein the first integrated circuit package covers a first area of the printed circuit board when positioned on the board. The printed circuit board also includes a second pattern of pin receptors formed substantially in the first area of the printed circuit board, wherein the second pattern is configured to receive the pins of a second integrated circuit package having a second plurality of pins so that when the second integrated circuit package is positioned on the second pattern of pin receptors, the second integrated circuit package substantially covers a second area of the printed circuit board that is substantially contained within the first area of the printed circuit board. The printed circuit board also includes a third plurality of pin receptors formed in a third pattern on a printed circuit board wherein the third pattern of pin receptors is substantially positioned within the first area and is configured to receive the pins of a third integrated circuit package having a third configuration of pins so that a third area of the printed circuit board is covered by the third integrated circuit package when the third integrated circuit package is positioned on the printed circuit board. Preferably, the third area overlaps the second area of the printed circuit board and is positioned substantially within the first area of the printed circuit board. Further, a plurality of conductive traces are also formed on or in the printed circuit board so as to interconnect corresponding pin receptors of the first, second, and third pluralities of pin receptors.

In one aspect of the invention, the first plurality of pin receptors comprise two parallel lines of pin receptors that are spaced apart and extend in a first direction. The second plurality of pin receptors comprise two parallel lines of pin receptors that are spaced apart and extend in a direction orthogonal to the direction of the first plurality of pin receptors so as to be positioned between the two parallel lines of the first pin receptors. Similarly, the third plurality of pin receptors comprise two parallel lines of pin receptors that extend in a direction orthogonal to the direction of the first pin receptor so as to extend between the two parallel lines of the first plurality of pin receptors. In this manner, a particular space on a printed circuit board is configured to receive one of three different integrated circuits, such as SRAM memory devices, having three different pin configurations.

In the preferred embodiment, the first, second and third integrated circuit packages contain SRAM memory devices. The SRAM memory devices of the preferred embodiment have the same number of pins and perform substantially the same function. The plurality of conductive traces are formed so that corresponding pin receptors on each of the three plurality of pin receptors are interconnected. Consequently, the functional operation of the SRAM memory in connection with other devices mounted on the printed circuit board is the same regardless of which SRAM device is positioned on the footprint.

It will be appreciated that a printed circuit boarding has a first pattern of pin receptors configured to receive the pins of a first component, a second pattern of pin receptors configured to receive the pins of a second component, and a third pattern of pin receptors configured to receive the pins of a third component, wherein the second and third patterns of pin receptors are positioned inside the first pattern of pin receptors. This results in a footprint that can accommodate three components having different pin configurations without requiring additional space on the printed circuit board for extra pin configurations. In the preferred embodiment, this results in the ability to selectively use one of three separate SRAM memory devices on the same space on a printed circuit board which allows for greater flexibility in choosing the SRAM memory devices based upon cost and availability. These and other objects and advantages of the present invention will become more readily apparent from the following description taken in conjunction with the accompanying drawings.

DETAILED DESCRIPTION OF THE PREFERRED EMBODIMENT

Figure 1:
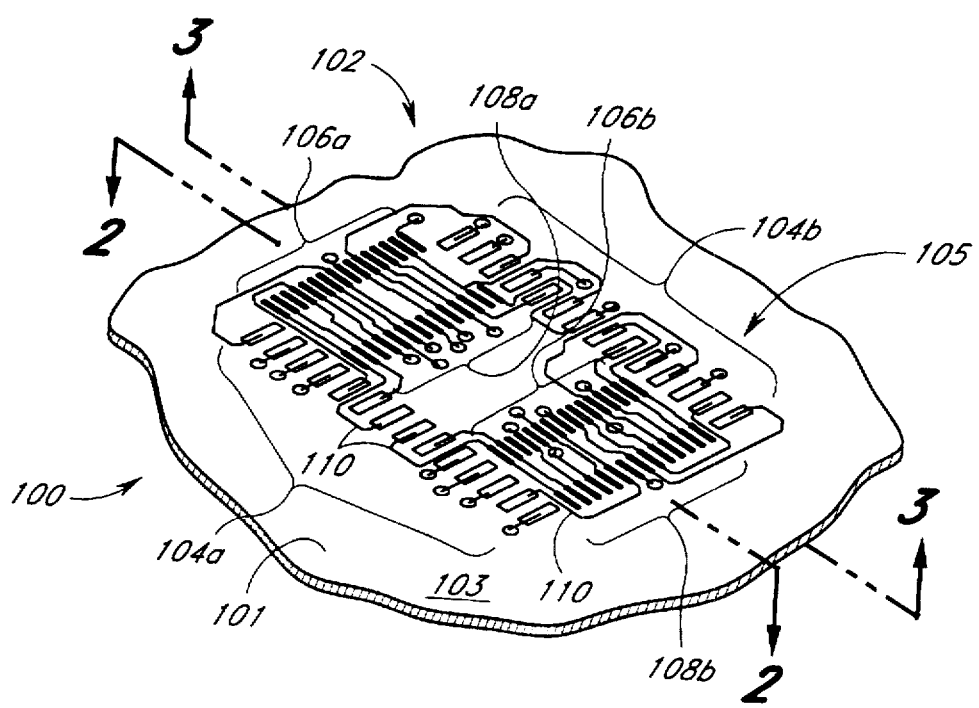
FIG. 1 is a perspective view of a printed circuit board having a footprint of pin receptors, wherein the footprint of pin receptors has a first plurality of pin receptors that are configured to receive the pins of a first component, a second plurality of pin receptors configured to receive pins of a second component, and a third plurality of pin receptors configured to receive the pins of a third component.
Figure 2:
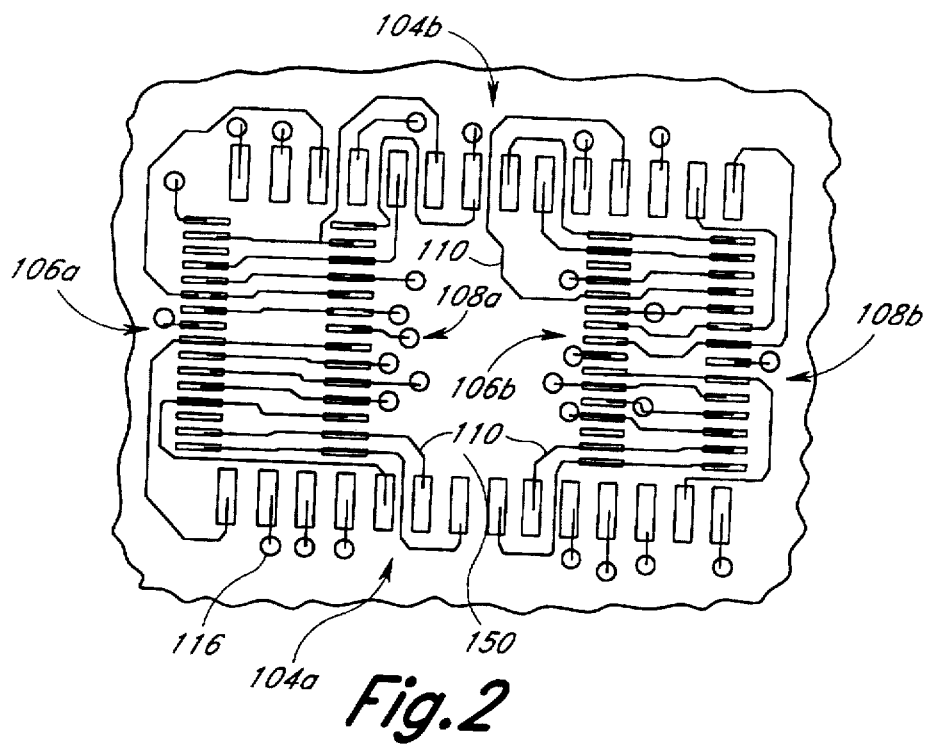
FIG. 2 is a top view of the footprint of pin receptors of FIG. 1 as viewed in the direction of the lines 2—2 in FIG. 1.

Reference will now be made to the drawings, wherein like numerals refer to like parts throughout. FIGS. 1 and 2 illustrate a preferred embodiment of a first surface 101 of a printed circuit board 100 which has a footprint 102 of pin receptors. The footprint of pin receptors comprises a first plurality of pin receptors 104a and 104b. The first plurality of pin receptors comprise two parallel lines of 14 pin receptors 104 that extend in a first direction and are spaced a first distance apart. The first plurality of pin receptors 104 in the preferred embodiment are spaced so as to receive an SRAM memory device having a total of 28 pins in an SOP-28 surface mount package.

FIGS. 1 and 2 also illustrate a second plurality of pin receptors 106 that comprise two parallel lines of 16 pin receptors 106a and 106b, wherein the parallel lines of pin receptors 106a and 106b are spaced a second distance apart and extend in a second direction which is orthogonal to the first direction. In the preferred embodiment, the second plurality of pin receptors 106 are configured to receive an SRAM memory device having a total of 32 pins in a TSOP-32 surface mount package.

FIGS. 1 and 2 also illustrate that the footprint 102 of the preferred embodiment includes a third plurality of pin receptors 108 which comprises two parallel lines of 14 pin receptors 108a and 108b that are spaced a third distance apart and also extend in the second direction so as to be orthogonal to the first direction. In the preferred embodiment, the third plurality of pin receptors 108 are configured to receive an SRAM surface mount device having a total of 28 pins in a TSOP-28 surface mount package.

Figure 4:
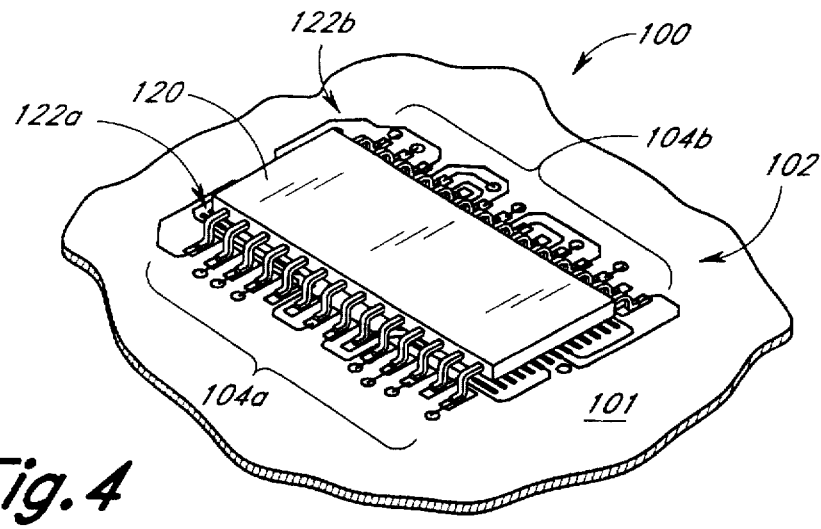
FIG. 4 is a perspective view of the printed circuit board of FIG. 1, wherein a first component is positioned on the printed circuit board with the pins of the first component positioned in alignment with the first plurality of pin receptors.
Figure 5:
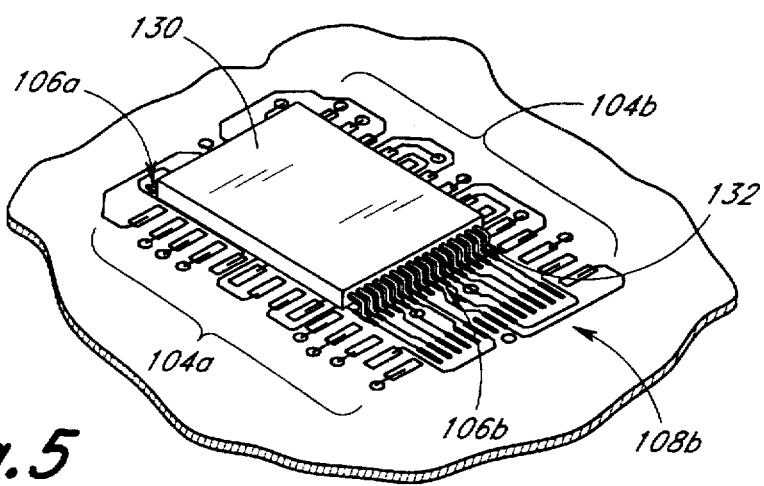
FIG. 5 is a perspective view of the printed circuit board of FIG. 1, wherein a second component is positioned on the printed circuit board with the pins of the second component positioned in alignment with the second plurality of pin receptors.
Figure 6:
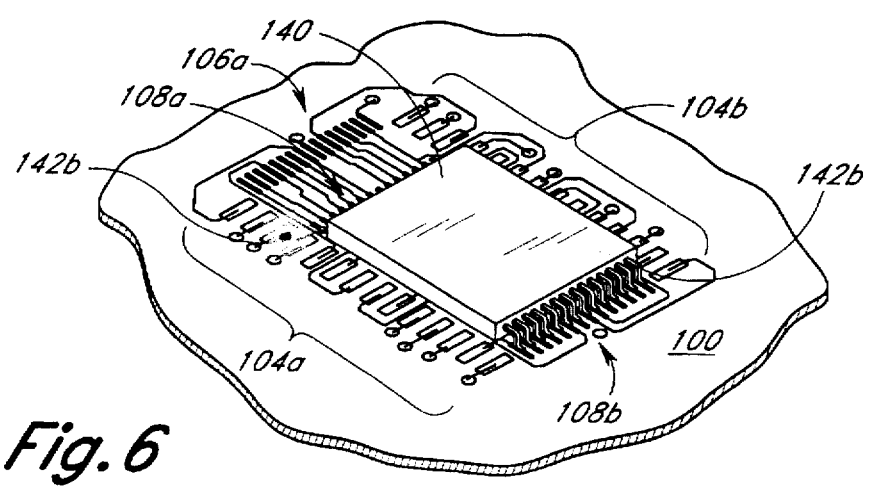
FIG. 6 is a perspective view of the printed circuit board of FIG. 1, wherein a third component is positioned on the footprint on the printed circuit board so that the pins of the third component are positioned in alignment with the third plurality of pin receptors.
Figure 7:
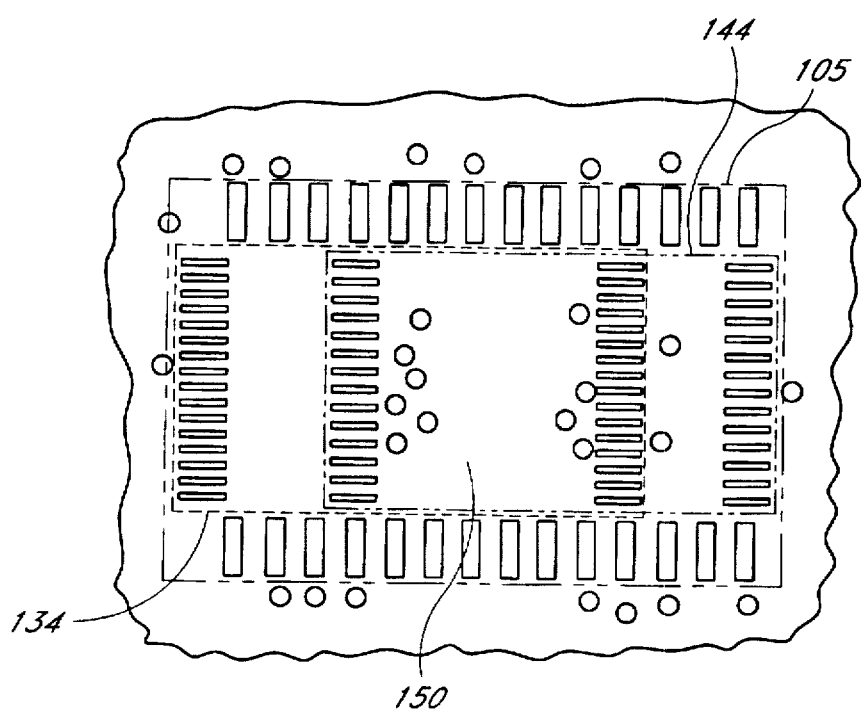
FIG. 7 illustrates the triple footprint pattern of FIGS. 1 and 2 with the interconnection lines removed to show the overlapping areas of the three footprints.

Hence, the lines of pin receptors 104a and 104b in conjunction with the pin receptors 106a and 108b form a generally rectangular area 105 on the printed circuit board that is capable of receiving one of three different surface mount SRAM devices in the manners shown in FIGS. 4–6. FIG. 7 more clearly illustrates the outline of the area 105.

Figure 3:
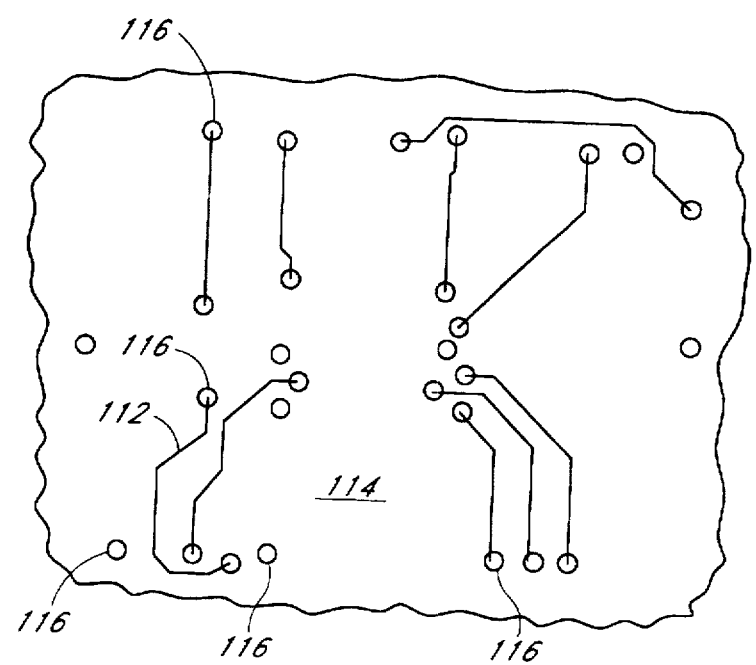
FIG. 3 is a top schematic view of an underlying layer (e.g., a bottom layer) of conductive traces which provide additional interconnections between the pin receptors of the footprint of FIG. 1 as viewed in the direction of the lines 3—3 in FIG. 1.

FIGS. 1 and 2 also illustrate that corresponding pin receptors in the pin receptors 104, 106 and 108 are interconnected via conductive traces 110. The conductive traces 110 are formed on the upper surface 101 of the printed circuit board 100. As illustrated in FIG. 3, conductive traces 112 are formed on a second layer 114 of the printed circuit board 100. The second layer 114 may be a bottom layer (as illustrated in FIG. 3), or the second layer 114 may be an inner layer of a multilayer printed circuit board. Specifically, some of the pin receptors 104, 106 and 108 have conductive traces 110 connected thereto which are then connected to the conductive traces 112 on the second layer 114 via one or more solder filled drilled holes (or vias) 116. Note that FIG. 3 is viewed from the bottom of the printed circuit board 100. Thus, the pattern of vias 116 in FIG. 3 is a mirror image of the pattern of vias 116 in FIG. 2.

The connection of the conductive traces between each of the pin receptors 104, 106 and 108 of the footprint 102 is accomplished using well-known printed circuit board fabrication techniques wherein the conductive traces 110 on the upper surface 101 of the printed circuit board 100 and the conductive traces 112 of the second layer 114 are formed using photolithography or other suitable techniques.

Note that FIGS. 2 and 3 only show the interconnections between the three sets of pin receptors 104, 106, 108. It should be understood that other interconnections (not shown) are provided to connect the pin receptors 104, 106, 108 to other components (not shown) on the printed circuit board 100 which provide inputs to the SRAM memory device and which receive outputs from the SRAM memory device. It should be further understood that the TSOP-32 package includes four more pins than either the SOP-28 package or the TSOP-28 package, and thus the second set of pin receptors 106 includes four more pin receptors than the first set of pin receptors 104 and the third set of pin receptors 108 (i.e., 32 pin receptors instead of 28 pin receptors). In the embodiment illustrated herein, four pin receptors in the second set of pin receptors 106 are not electrically connected to pin receptors in the first set of pin receptors 104 or the third set of pin receptors 108. Note that vias 116 in FIGS. 2 and 3 that are connected to a pin in only one of the three sets of pin receptors are connected directly to either a power plane or a ground plane in respective layers of the printed circuit board which are not shown in the drawings.

FIGS. 2 and 3 illustrate the preferred layout of the conductive traces 110 and 112 of the footprint 102 of the preferred embodiment. It will be understood, however, that the layout of the conductive traces 110, 112 can be any of a number of different possible layouts without departing from the spirit of the present invention so long as each of the corresponding pin receptors 104, 106 and 108 are interconnected. This requires that each of the pin receptors 104 be connected to a single pin receptor 106 and a single pin receptor 108 and vice-versa. It will be understood that due to the large number of pin receptors, the bottom layer (or inner layer) 114 of conductive traces will generally need to be used to interconnect the corresponding pin receptors.

FIGS. 4, 5 and 6 illustrate that the area 105 defined by the pin receptors 104a, 108b, 104b and 106a is capable of receiving three different components. Specifically, FIG. 4 illustrates that a first component 120 having a first plurality of pins 122a and 122b is mounted on the printed circuit board 100 with the first plurality of pins 122a and 122b mounted on the first plurality of pin receptors 104a and 104b. In particular, FIG. 4 illustrates that an SOP-28 SRAM memory device 120 is mounted on the footprint 102 so that the pins 122 of the SRAM memory device 120 are mounted on the pin receptors 104. The memory device 120 covers substantially all of the first area 105.

FIG. 5 illustrates a second component 130 that is mounted on the footprint 102 of the preferred embodiment. In particular, FIG. 5 illustrates that a TSOP-32 SRAM surface mount device 130 having a second plurality of pins 132 is mounted on the footprint 102 of the preferred embodiment. In particular, the plurality of pins 132 are mounted on the pin receptors 106a and 106b so that the second integrated circuit package 130 covers a second area 134 (see FIG. 7) of the printed circuit board 100 that is entirely contained within the first area 105.

FIG. 6 illustrates that a third component package 140 having a plurality of pins 142 is mounted on the footprint 102 of the preferred embodiment. In the preferred embodiment, the third component package 140 comprises a TSOP-28 SRAM surface mount device. The plurality of pins 142 are mounted on the pin receptors 108 so that the device 140 covers a third area 144 (see FIG. 7) of the printed circuit board 100. The third area 144 is contained within the first area 105 and overlaps the second area 134. In particular, since the pin receptors 108a are positioned between the pin receptors 106a and 106b and also since the pin receptors 106b are positioned between the pin receptors 108a and 108b, when the component 130 and the component 140 are mounted on the printed circuit board 100 there is an area 150 (see FIG. 7) of the printed circuit board 100 that both of the devices 130 and 140 will cover.

It will be appreciated that the footprint 102 of the preferred embodiment allows for three different devices having three different pin configurations to be mounted on the printed circuit board in a single area of the printed circuit board. This allows the manufacturer of the printed circuit board to purchase comparable components from three different suppliers and still have the printed circuit board perform its desired function. Further, since the second plurality of pin receptors 106 and the third plurality of pin receptors 108 are formed in the area 105 of the printed circuit board 100 that is not otherwise accessible, when the first component 120 is mounted on the printed circuit board 100, the addition of the second plurality of pin receptors 106 and the third plurality of pin receptors 108 allows for three different components 120, 130 and 140 to be used interchangeably without requiring the utilization of any additional space on the printed circuit board 100.

Although the foregoing description of the preferred embodiments of the present invention has shown, described and pointed out the fundamental novel features of the invention, it will be understood that various omissions, substitutions and changes in the form of the detail of the apparatus as illustrated as well as the uses thereof, may be made by those skilled in the art without departing from the spirit of the present invention. Consequently, the scope of the invention should not be limited to the foregoing discussion, but should be defined as the appended claims.

What is claimed is:

1. A printed circuit board comprising:

a first plurality of pin receptors formed in a first row and in a second row parallel to said first row on a first surface of said board, wherein said first and second rows of said first plurality of pin receptors define a portion of an outer boundary of a first area of said printed circuit board and wherein said first plurality of pin receptors are configured to receive a plurality of pins on a first component so that, when said first component is positioned on said printed circuit board, said first component substantially covers said first area;

a second plurality of pin receptors formed in a third row and in a fourth row parallel to said third row on said first surface of said board, wherein said third and fourth rows of said second plurality of pin receptors are positioned within said first area and wherein said second plurality of pin receptor are configured to receive a plurality of pins on a second component so that, when said second component is positioned on said printed circuit board, said second component covers a first portion of said first area;

a third plurality of pin receptors formed in a fifth row and in a sixth row parallel to said fifth row on said first surface of said board, wherein said fifth and sixth rows of said third plurality of pin receptors are positioned within said first area and wherein said third plurality of pin receptor are configured to receive a plurality of pins on a third component so that, when said third component is positioned on said printed circuit board, said third component covers a second portion of said first area; and a plurality of conductors interconnecting pin receptors in said first plurality of pin receptors with corresponding pin receptors in said second plurality of pin receptors and with corresponding pin receptors in said third plurality of pin receptors.

2. The printed circuit board of claim 1, wherein said first and second rows of said first plurality of pin receptors extend in a first direction.

3. The printed circuit board of claim 2, wherein said third and fourth rows of said second plurality of pin receptors extend in a second direction that is substantially orthogonal to said first direction.

4. The printed circuit board of claim 3, wherein said fifth and sixth rows of said third plurality of pin receptors extend in said second direction.

5. The printed circuit board of claim 4, wherein one of said lines of pin receptors of said second plurality of pin receptors is interposed between said two lines of said third plurality of pin receptors and wherein one of said lines of pin receptors of said third plurality of pin receptors is interposed between said two lines of said second plurality of pin receptors so that said first and said second portions of said first area overlap.

6. The printed circuit board of claim 5, wherein said first and third pluralities of pin receptors comprise a first number of pin receptors each and said second set of pin receptors comprises a second number of pin receptors, said second number different from said first number.

7. The printed circuit board of claim 1, wherein said first plurality of pin receptors are configured to receive a SRAM memory device having, two parallel rows of connector pins, each row having fourteen pins.

8. The printed circuit board of claim 7, wherein said second plurality of pin receptors are configured to receive a SRAM memory device having two parallel rows of connector pins, each row having sixteen pins.

9. The printed circuit board of claim 8, wherein said third plurality of pin receptors are configured to receive a SRAM memory device having two parallel rows of connector pins, each row having fourteen pins.

10. The printed circuit board of claim 1, further comprising a layer having conductive traces that interconnect pin receptors in said first, second and third pluralities of pin receptors.

11. A printed circuit board comprising:

a first plurality of pin receptors formed on a first surface of said board so as to form first and second lines of pin receptors which extend in a first direction, said first line parallel to said second line, wherein said first plurality of pin receptors define an outer boundary of a first area of said printed circuit board and wherein said first plurality of pin receptors are configured to receive a plurality of pins on a first component so that, when said first component is positioned on said printed circuit board, said first component substantially covers said first area;

a second plurality of pin receptors formed on said first surface of said board so as to form third and fourth lines of pin receptors which extend in a second direction, said third line parallel to said fourth line, wherein said second plurality of pin receptors are positioned within said first area and wherein said second plurality of pin receptor are configured to receive a plurality of pins on a second component so that, when said second component is positioned on said printed circuit board, said second component covers a first portion of said first area;

a third plurality of pin receptors formed on said first surface of said board so as to form fifth and sixth lines of pin receptors which extend in said second direction, said fifth line parallel with said sixth line, wherein said third plurality of pin receptors are positioned within said first area and wherein said third plurality of pin receptors are configured to receive a plurality of pins on a third component so that, when said third component is positioned on said printed circuit board, said third component covers a second portion of said first area; and a plurality of conductors interconnecting pin receptors in said first plurality of pin receptors with corresponding pin receptors in said second plurality of pin receptors and with corresponding pin receptors in said third plurality of pin receptors.

12. The printed circuit board of claim 11, wherein one of said third and fourth lines of pin receptors of said second plurality of pin receptors is interposed between said fifth and sixth lines of said third plurality of pin receptors and wherein one of said fifth and sixth lines of pin receptors of said third plurality of pin receptors is interposed between said third and fourth lines of said second plurality of pin receptors so that said first and said second portions of said first area overlap.

13. The printed circuit board of claim 11, further comprising a layer having conductive traces that interconnect pin receptors in said first, second and third pluralities of pin receptors.

14. The printed circuit board of claim 11, wherein said second direction is substantially orthogonal to said first direction.

15. The printed circuit board of claim 14, wherein said first and third pluralities of pin receptors comprise a first number of pin receptors and wherein said second plurality of pin receptors comprise a second number of pin receptors, said second number different from said first number.

16. The printed circuit board of claim 11, wherein said first plurality of pin receptors are configured to receive a SRAM memory device having two parallel rows of connector pins, each row having fourteen pins.

17. The printed circuit board of claim 16, wherein said second plurality of pin receptors are configured to receive a SRAM memory device having two parallel rows of connector pins, each row having sixteen pins.

18. The printed circuit board of claim 16, wherein said third plurality of pin receptors are configured to receive a SRAM memory device having two parallel rows of connector pins, each row having fourteen pins.

* * * * *